United States Patent
Wang

(10) Patent No.: US 9,613,959 B2
(45) Date of Patent: Apr. 4, 2017

(54) METHOD OF FORMING METAL GATE TO MITIGATE ANTENNA DEFECT

(71) Applicant: Taiwan Semiconductor Manufacturing Co., Ltd., Hsin-Chu (TW)

(72) Inventor: Shiang-Bau Wang, Pingzchen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/810,729

(22) Filed: Jul. 28, 2015

(65) Prior Publication Data

US 2017/0033105 A1    Feb. 2, 2017

(51) Int. Cl.

| | |
|---|---|
| *H01L 27/092* | (2006.01) |
| *H01L 21/311* | (2006.01) |
| *H01L 21/321* | (2006.01) |
| *H01L 21/263* | (2006.01) |
| *H01L 29/49* | (2006.01) |
| *H01L 29/08* | (2006.01) |
| *H01L 29/66* | (2006.01) |

(Continued)

(52) U.S. Cl.
CPC ...... *H01L 27/0924* (2013.01); *H01L 21/2633* (2013.01); *H01L 21/31105* (2013.01); *H01L 21/32115* (2013.01); *H01L 21/823821* (2013.01); *H01L 29/0847* (2013.01); *H01L 29/495* (2013.01); *H01L 29/4966* (2013.01); *H01L 29/6656* (2013.01); *H01L 29/66795* (2013.01); *H01L 29/7851* (2013.01)

(58) Field of Classification Search
CPC ............. H01L 27/0924; H01L 21/2633; H01L 21/31105; H01L 21/32115; H01L 21/823821; H01L 29/0847; H01L 29/495; H01L 29/496; H01L 29/6656; H01L 29/66795; H01L 29/7851
See application file for complete search history.

(56) References Cited

U.S. PATENT DOCUMENTS

| | | | |
|---|---|---|---|
| 9,018,711 B1 | 4/2015 | Cai et al. | |
| 2014/0179093 A1* | 6/2014 | Choi | ................ H01L 21/28088 438/589 |

(Continued)

*Primary Examiner* — Julio J Maldonado
*Assistant Examiner* — Farun Lu
(74) *Attorney, Agent, or Firm* — Eschweiler & Potashnik, LLC

(57) ABSTRACT

The present disclosure relates to methods of forming a field effect transistor (FET) over a substrate, and associated integrated circuit device that improve etching back profile and prevent metal gate defect. In some embodiments, a recess is formed through an inter-layer dielectric (ILD) layer along a sidewall spacer and filled with a high-κ dielectric layer and a metal gate. An etch back is performed to lower the high-κ dielectric layer and the metal gate, where an "antenna" shaped residue of the high-κ dielectric material and the metal gate material is left at the boundary region of the high-κ layer and the metal gate, along the sidewall spacer. Then a second etch is performed to the sidewall spacer, removing a top edge portion of the sidewall spacer. Then one more step of etch can be performed to the high-κ layer and the metal gate to planarize and remove the residue.

20 Claims, 8 Drawing Sheets

(51) Int. Cl.
*H01L 29/78* (2006.01)
*H01L 21/8238* (2006.01)

(56) References Cited

U.S. PATENT DOCUMENTS

| | | | | |
|---|---|---|---|---|
| 2015/0035061 A1* | 2/2015 | Yoon | ................ | H01L 29/66545 257/365 |
| 2015/0041905 A1* | 2/2015 | Xie | .................... | H01L 29/6656 257/369 |
| 2015/0325574 A1* | 11/2015 | Huang | ................ | H01L 27/0886 257/390 |

\* cited by examiner

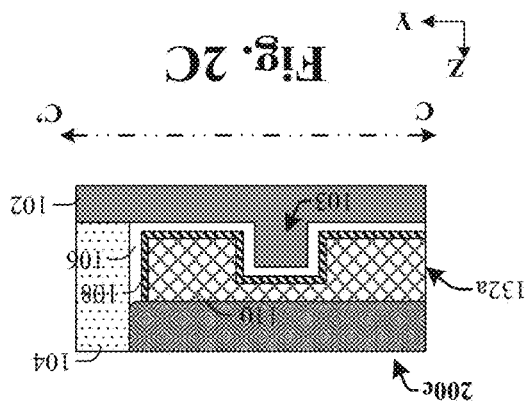
Fig. 1
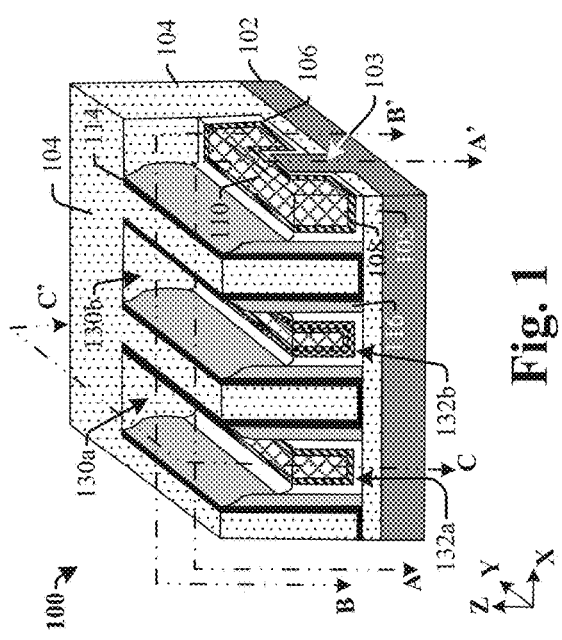
Fig. 2C
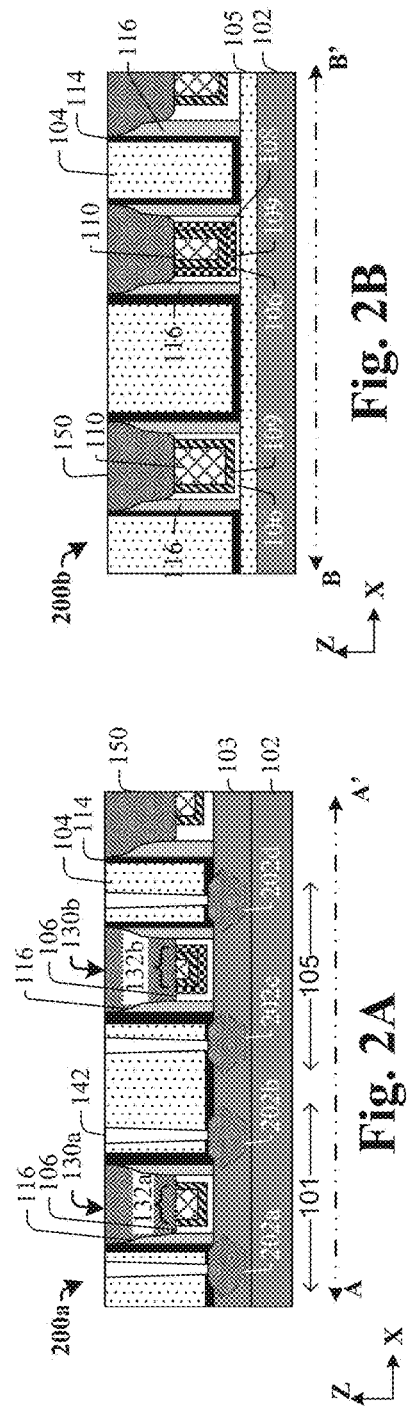
Fig. 2A
Fig. 2B

METHOD OF FORMING METAL GATE TO MITIGATE ANTENNA DEFECT

BACKGROUND

The semiconductor manufacturing industry has experienced exponential growth over the last few decades. In the course of semiconductor evolution, functional density (i.e., the number of interconnected devices per chip area) has generally increased while geometry size (i.e., the smallest component or line that can be created using a fabrication process) has generally decreased. One advancement has been the development of semiconductor devices, such as transistors, employing metal gates insulated by materials having a high dielectric constant (high-κ). Such semiconductor devices have improved performance with decreased feature sizes, relative to traditional polysilicon gates insulated by silicon dioxide.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a perspective-sectional of some embodiments of an integrated circuit comprising a finFET device.

FIG. 2A illustrates a cross-sectional view of some embodiments of the integrated circuit of FIG. 1 along a line A-A'.

FIG. 2B illustrates a cross-sectional view of some embodiments of the integrated circuit of FIG. 1 along a line B-B'.

FIG. 2C illustrates a cross-sectional view of some embodiments of the integrated circuit of FIG. 1 along a line C-C'.

DETAILED DESCRIPTION

Figure 3:
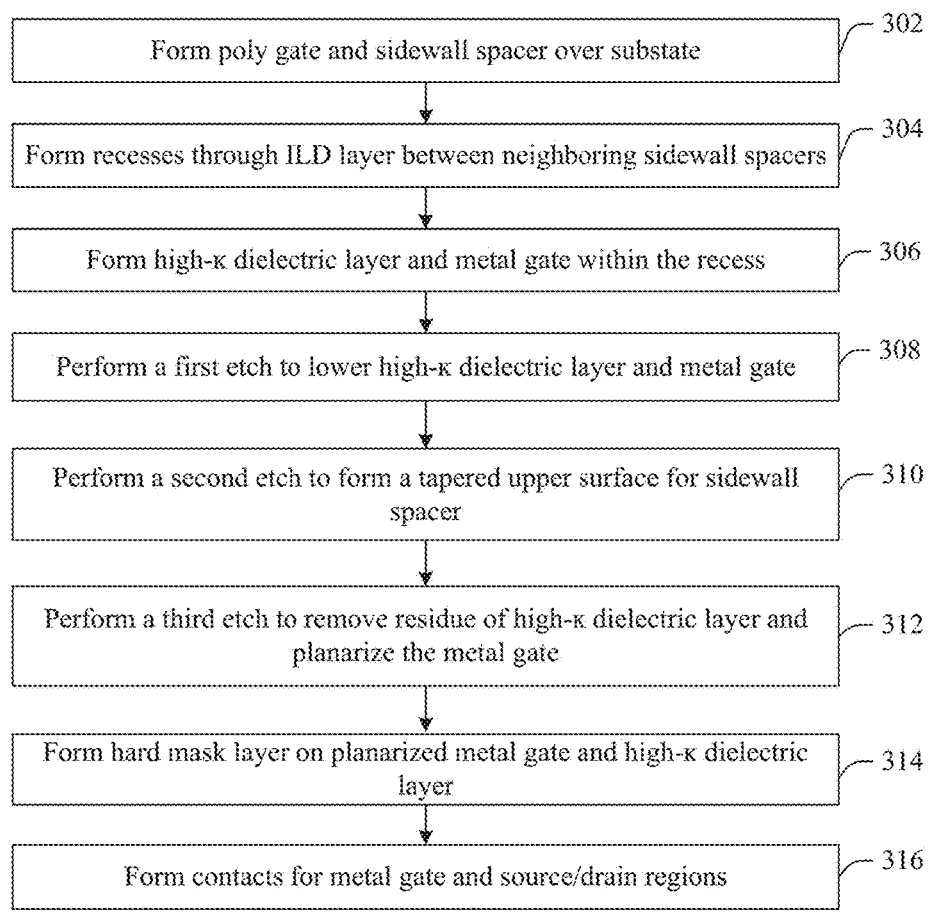
FIG. 3 illustrates a flow diagram of some embodiments of a method of forming an integrated circuit.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-κ dielectric material has a dielectric constant, κ, which is higher than that of silicon dioxide. High-κ dielectrics are used in semiconductor manufacturing processes where they are usually used to replace a silicon dioxide gate dielectric. For example, high-κ metal gate (HKMG) technology employs a metal gate (MG) over a high-κ gate dielectric, and offers performance improvements over traditional transistors with polysilicon gates and/or silicon dioxide gate dielectrics. As scaling continues to reduce the size of the HKMG circuits, however, increases in aspect ratio can cause filling and etch back problems for HKMG manufacturing processes.

More specifically, in some conventional approaches for forming a HKMG structure, a sacrificial gate, which is arranged between sidewall spacers, is formed over a substrate, and a low-κ dielectric layer (sometimes referred to as an inter-layer dielectric (ILD) or inter-metal dielectric (IMD)) is formed over the sacrificial gate. After a chemical mechanical planarization (CMP) operation is performed to planarize a top surface of the sacrificial gate and low-κ dielectric layer, the sacrificial gate electrode is then selectively removed to leave a recess between the sidewall spacers. A high-κ gate dielectric is then formed along a lower surface and sidewalls of the recess, and metal is deposited over the high-κ gate dielectric to fill the remainder of the recess. Another CMP operation is then performed to make upper surfaces of the metal, high-κ gate dielectric, and low-κ dielectric co-planar. The planarized upper surface of the metal is then selectively etched back or recessed relative to a top surface of the low-κ dielectric layer. Unfortunately, due to the small opening size of this recess, a small amount of metal and/or high-κ gate dielectric ("residue") can be inadvertently left along the sidewalls of the recess. The residue can be said to have an "antenna" shape, wherein more residue can accumulate in lower corners of the recess and can extend upwardly in a tapered manner to an upper region of the recess. Hard mask material then deposited to fill the remainder of this recess, and is CMP'd back to form a hard mask in the recess, and additional etches are performed on the structure with the hard mask in place.

Since the antenna-shaped residue extends upwardly to the upper region of the recess between hard mask and sidewall spacer, it can be exposed to ambient environment after the CMP planarization process is performed to form the hard mask. The exposed antenna-shaped residue may introduce leakage or short defect when contacts or other conductive layers are formed thereon. Also, the ensuing wet cleaning or etching processes can undesirably propagate downward through the antenna-shaped residue (i.e., around and under the outer edges of the hard mask), ultimately damaging the underlying metal gate, high-κ dielectric, and/or other layers. For example, in some cases the ensuing etch may partially or fully remove the metal gate and/or high-κ dielectric layer and/or can structurally weaken the resultant structure; leading to a variety of problematic issues.

Accordingly, the present disclosure relates to techniques to mitigate this antenna-shaped residue and thereby improves reliability in HKMG transistors. In some embodiments, after any antenna-shaped residue is formed, additional processing steps are used to remove the antenna-shaped residue. These additional process steps may alter the sidewall profile over the metal gate so that the hard mask formed over the metal gate has sidewalls which are in direct contact with the sidewall spacer (i.e., without any antenna-shaped residue intervening between the hard mask and sidewall spacers). In such ways, the residue is reduced and a better profile of the metal gate and high-κ layer have sidewall profiles that help to prevent gates from being inadvertently damaged and/or removed, thereby improving yields and performance of the FET device. Although these additional process steps may add some cost and complexity to the manufacturing process, they provide improved device reliability.

FIG. 1 illustrates a perspective-sectional view of some embodiments of an integrated circuit comprising an integrated circuit 100 with a number of FinFETs disposed thereon. As will be appreciated in greater detail herein (e.g., with regards to the subsequent manufacturing processes described further herein), the integrated circuit 100 is formed by a manufacturing process that limits the effects of antenna-shaped defects, and has structural features that may evidence these improved manufacturing methodologies.

The integrated circuit 100 includes a semiconductor fin 103, such as a silicon fin, which extends over a substrate 102 along a first direction X. As can be seen from cross-sectional line A-A' (FIG. 1 and FIG. 2A), first and second finFETs 101, 105 are disposed along the length of the fin 103. As shown in FIG. 2A, the first finFET 101 includes a first metal gate 132a, which is arranged over a first channel region in the fin 103 and which is arranged between first and second source/drain regions 202a, 202b. The second finFET 105 includes a second metal gate 132b, which is arranged over a second channel region in the fin 103 and which is arranged between third and fourth source/drain regions 202c, 202d. In some embodiments, the source/drain regions 202a-202d comprise epitaxially grown SiGe or SiP regions that extend above an upper surface of the fin 103. A high-κ dielectric layer 106 acts as a gate dielectric and separates the metal gates 132 from the channel region of the fin 103. An etch stop layer 114 can be disposed along sidewall and bottom surfaces of the ILD layer 104 over the substrate 102 and the fin 103. As shown in FIG. 2C, the metal gate 132a "wraps" around the sidewall and top surfaces of the fin 103 to provide suitable depletion (e.g., full depletion) in the fin 103 during device operation.

In some embodiments, the first metal gate 132a corresponds to an n-type finFET and the second metal gate 132b corresponds to a p-type finFET. In some embodiments, contacts 142 can be disposed through the ILD layer 104 and the etch stop layer 114 to reach the source/drain regions 202. Further, as shown in FIG. 2B, the first metal gate 132a and the second metal gate 132b may comprise a metal layer 110 having bottom and sidewall surfaces covered by a barrier layer 108. The metal gates 132 can further comprise additional metal layers. For example, the second metal gate 132b can further comprise a work function metal layer 109 disposed between the barrier layer 108 and the high-κ dielectric layer 106, while the first metal gate 132a contains a different work function metal layer or lacks such a work function metal layer.

As illustrated in FIG. 1, the first metal gate 132a is disposed within a first recess 130a and the second metal gate 132b is disposed within a second recess 130b. Sidewall spacers 116 are disposed along sidewalls of the recesses 130. In some embodiments, a dielectric layer 105 can be disposed on the substrate separated by the fin 103. In some other embodiments, the dielectric layer 105, or an insulating layer made of other materials, can be disposed underlying the fin 103, separating the fin 103 from the substrate 102. The sidewall spacer 116 may sit on the dielectric layer 105 and extend upwardly along a sidewall of the fin 103. The high-κ dielectric layer 106 may also disposed on the dielectric layer 105 and extend upwardly along the sidewall of the fin 103. The sidewall spacer 116 can comprise $SiO_2$, SiN, SiC, SiCN, SiON, SiOCN, or a combination thereof. In some embodiments, the sidewall spacer 116 has a tapered upper surface. A height of the sidewall spacer 116 monotonically decreases as approaching the metal gates 132. The height of the sidewall spacer 116 may be greater than that of the high-κ dielectric layer 106. The tapered upper surface of the sidewall spacer 116 can be laterally higher than those of the high-κ dielectric layer 106 and the metal gates 132. In some embodiments, the upper surfaces of the high-κ dielectric layer 106 and the metal gates 132 are co-planar. In some embodiments, the tapered upper surface of the sidewall spacer 116 extends downward to an upper surface of the high-κ dielectric layer 106, while in some alternative embodiments the high-κ dielectric layer 106 abuts a vertical inner sidewall of sidewall spacer 116 rather than tapered upper surface of sidewall spacer 116.

As shown in FIGS. 2A-2C, a hard mask 150 can be disposed over the metal gates 132a, 132b, and directly laterally abuts the etch stop layer 114 at upper portions of the recesses at 132a, 132b. Advantageously, the tapered upper surface of the sidewall spacer 116 being disposed beneath the upper surface of hard mask 150 in the present disclosure can evidence the fact that additional etch processing was performed on the sidewall spacer 116 and/or recesses 130a, 130b to remove antenna-shaped residue from the sidewalls of recesses 130a, 130b. Further, because this tapering allows the hard mask 150 to directly abut the etch stop layer 114 (i.e., no portion of antenna-shaped residue extends upwards between the outer edge of hard mask 150 and etch stop layer 114), the structure illustrated in FIGS. 1 and 2a-2c is more impervious to etching of the hard mask, compared to previous approaches. Thus, compared to previous approaches, the structure of FIG. 1 can exhibit improved reliability.

FIG. 3 shows a flow diagram of a method 300 of forming an integrated circuit in accordance with some embodiments. While the disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 302, sacrificial poly gates are formed over a substrate. A sidewall spacer is formed alongside the poly gate.

At act 304, an inter-layer dielectric (ILD) layer is formed between the poly gates. Then, the poly gates are removed to form a recess through the ILD layer between neighboring sidewall spacers.

At act 306, a high-κ dielectric layer is formed to cover bottom and sidewall surfaces of the recess. A metal gate is formed within a reminder of the recess not occupied by the high-κ dielectric layer.

At act 308, a first series of etches is performed to lower the high-κ dielectric layer and the metal gate. A residue of the high-κ dielectric layer is left along the sidewall spacer.

At act 310, a second etch is performed to form a tapered upper surface for the sidewall spacer. A height of the sidewall spacer monotonically decreases approaching the metal gate.

At act 312, a third series of etches is performed to remove the residue of the high-κ dielectric layer and planarize the metal gate.

At act 314, a hard mask layer is formed on the planarized metal gate and high-κ dielectric layer.

At act 316, contacts are formed for the metal gate and source/drain regions.

FIGS. 4-15 illustrate some embodiments of cross-sectional views showing a method of an integrated circuit (IC) comprising a field effect transistor (FET). Although FIGS. 4-15 are described in relation to method 300, it will be appreciated that the structures disclosed in FIGS. 4-15 are not limited to such a method, but instead may stand alone as structures independent of the method.

Figure 4:
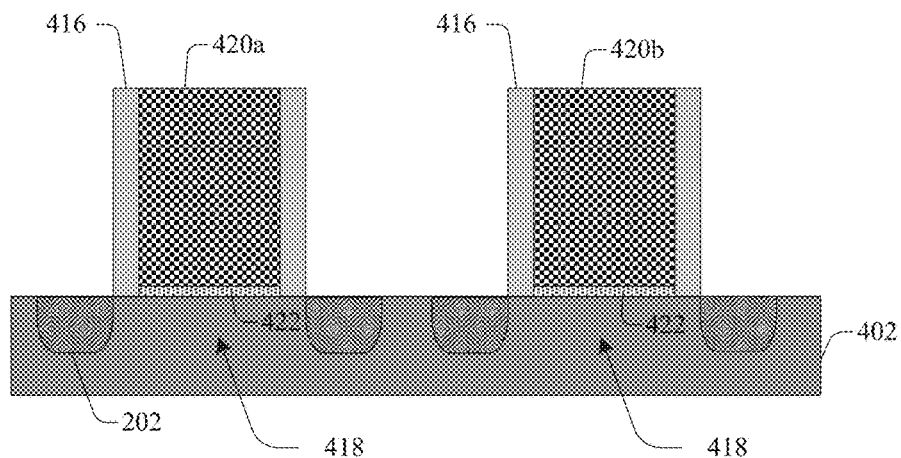
FIGS. 4-15 illustrate cross-sectional views of some embodiments showing a method of forming an integrated circuit.

FIG. 4 illustrates some embodiments of a cross-sectional view 400 corresponding to act 302. As shown in cross-sectional view 400, sacrificial polysilicon gates 420a, 420b are patterned over a substrate 402. In some embodiments, a gate oxide layer 422 is formed on upper surface of substrate 402 prior to formation of the sacrificial polysilicon gates 420a, 420b. After the sacrificial polysilicon gates 420a, 420b are patterned, sidewall spacers 416 are formed along sidewalls of the sacrificial polysilicon gates 420 and the gate oxide layer 422. The sidewall spacers 416 can be formed by depositing a conformal spacer layer over the sacrificial polysilicon gates 420, and etching the conformal spacer layer back to leave sidewall spacers 416 along sidewalls of the sacrificial polysilicon gates 420 and gate oxide layer 422. After the sidewall spacers are formed, source/drain regions 202 can be formed, for example through ion implantation, or by forming recesses in the substrate 402 on opposite sides of the sacrificial gates 420 and filling the recesses with a strain-inducing source/drain material (e.g., epitaxially-grown SiP or SiGe).

In some embodiments, the substrate 402 can be planar with a uniform thickness. Further, the substrate 402 can be n- or p-type, and can, for example, be a bulk Si wafer or a silicon-on-insulator (SOI) substrate. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate (e.g. AlGaAs), with or without additional insulating or conducting layers formed thereover, among others. In some other embodiments, the substrate 402 can be a finned substrate comprising a raised fin formed over a planar substrate. The source/drain regions 202 and channel regions 418 therebetween are formed within the raised fin. The sidewall spacer 416 can be formed by dielectric materials such as silicon dioxide ($SiO_2$), silicon nitride (SiN), silicon carbide (SiC), silicon carbonitride (SiCN), silicon oxynitride (SiON), silicon oxycarbonitride (SiOCN) or the combination thereof.

Figure 5:
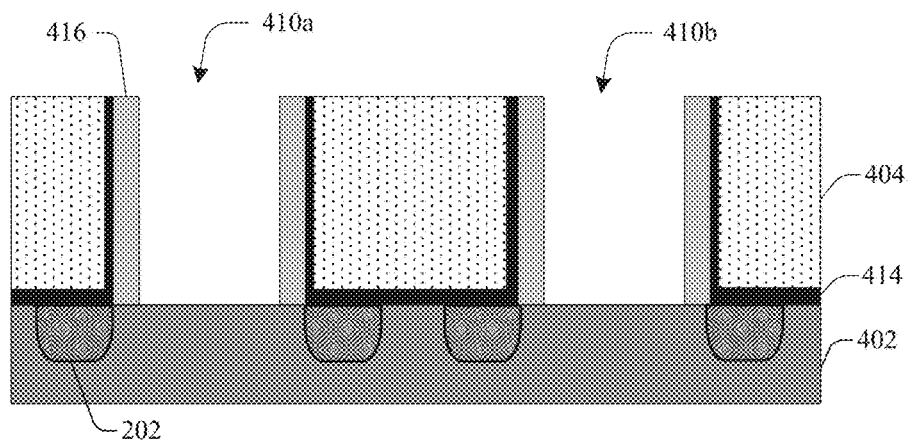

FIG. 5 illustrates some embodiments of a cross-sectional view 500 corresponding to act 304. As shown in cross-sectional view 500, an inter-layer dielectric (ILD) layer 404 is deposited over the structure of FIG. 4 and fills gaps between outer edges of neighboring pairs of sidewall spacers. A planarization process is then carried out, after which the sacrificial polysilicon gates (420a, 420b of FIG. 4 possibly together with gate oxide 422) are removed to form a first recess 410a and a second recess 410b, leaving the sidewall spacers 416 and the ILD layer 404 in place.

In some embodiments, the ILD layer 404 can be a silicon dioxide ($SiO_2$) layer, having a dielectric constant of approximately 3.9, while in some other embodiments, the ILD layer 404 can be silicon nitride or silicon oxynitride. The ILD layer 404 can also be a porous or solid low-κ dielectric having a dielectric constant of less than 3.9. In some embodiments, an etch stop layer 414 is formed prior to forming the ILD layer 404, surrounding bottom and sidewall surfaces of the ILD layer 404. The etch stop layer 414 may comprise silicon carbide or silicon nitride.

Figure 6:
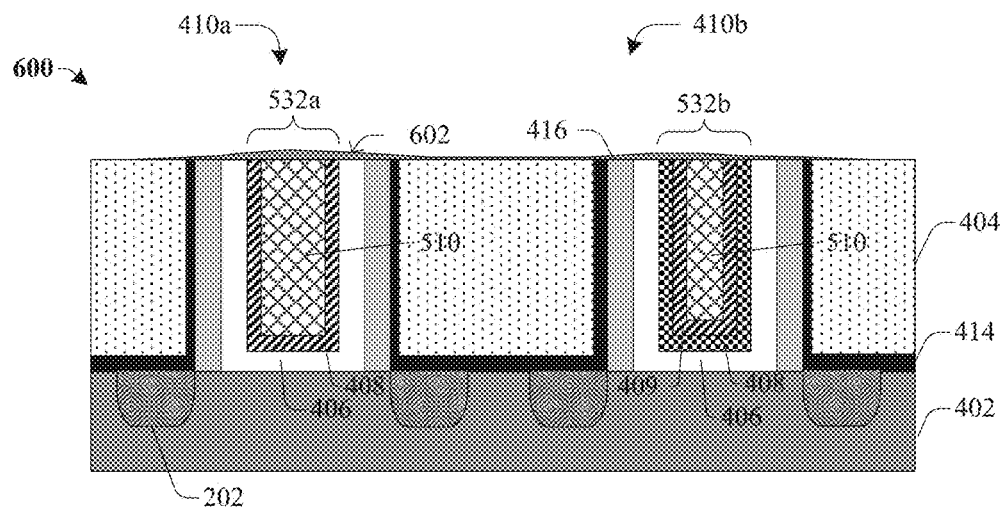

FIG. 6 illustrates some embodiments of a cross-sectional view 600 corresponding to act 306. As shown in cross-sectional view 600, a high-κ dielectric layer 406 is formed to cover bottom and sidewall surfaces of the recesses 410. Metal gates 532a, 532b can be formed comprising a barrier layer 408 formed along the high-κ dielectric layer 406 and a metal layer 510 formed within the reminder spacer of the recess 410. In some embodiments, the first metal gate 532a is formed within the first recess 410a for an n-channel field effect transistor (n-FET) and the second metal gate 532b is formed within the second recess 410b for a p-channel field effect transistor (p-FET). In some embodiments, a work function metal layer 409 is formed within the second recess 410b but not the first recess 410a between the barrier layer 408 and the high-κ dielectric layer 406. In some embodiments, the metal layer 510 comprises tungsten (W). The work function metal layer 409 can comprise titanium (Ti), aluminum (Al) or titanium nitride (TiN). A planarization is then performed such that upper surfaces of the ILD layer 404, the sidewall spacer 416, the high-κ dielectric layer 406, the barrier layer 408 and the metal gates 532a, 532b are laterally aligned. In some embodiments, the planarization can comprise a chemical-mechanical polishing (CMP) process. A residue film 602, which may comprise oxidation material and/or other reaction product can be left on top of the planarized top surface.

Figure 7:
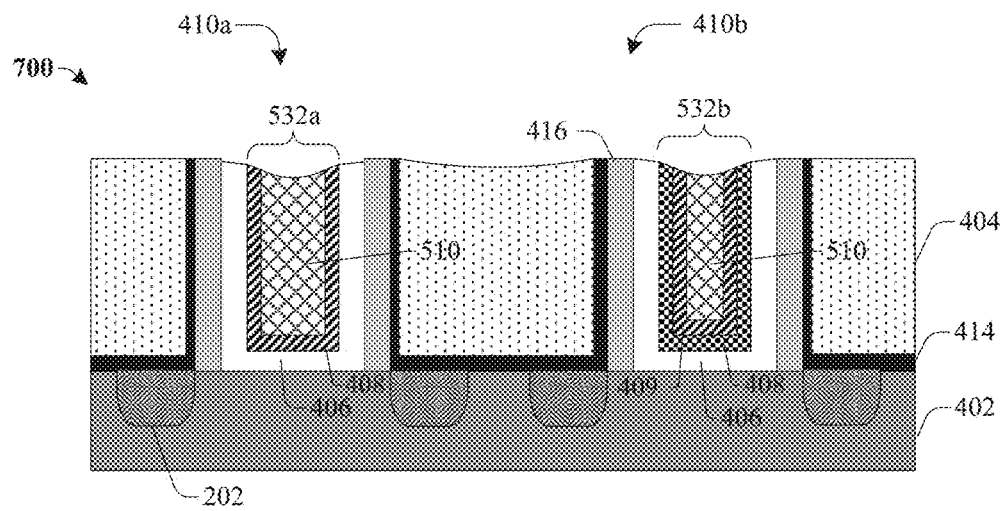
Figure 8:
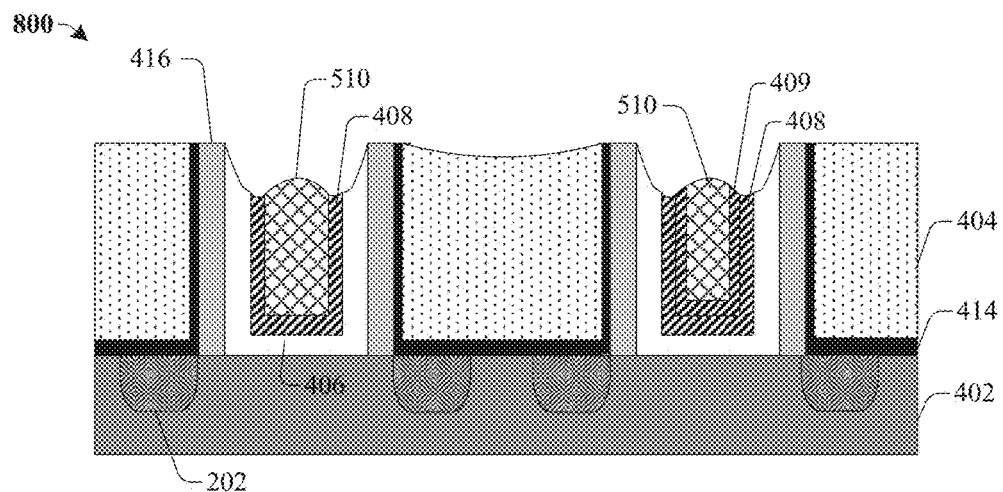
Figure 9:
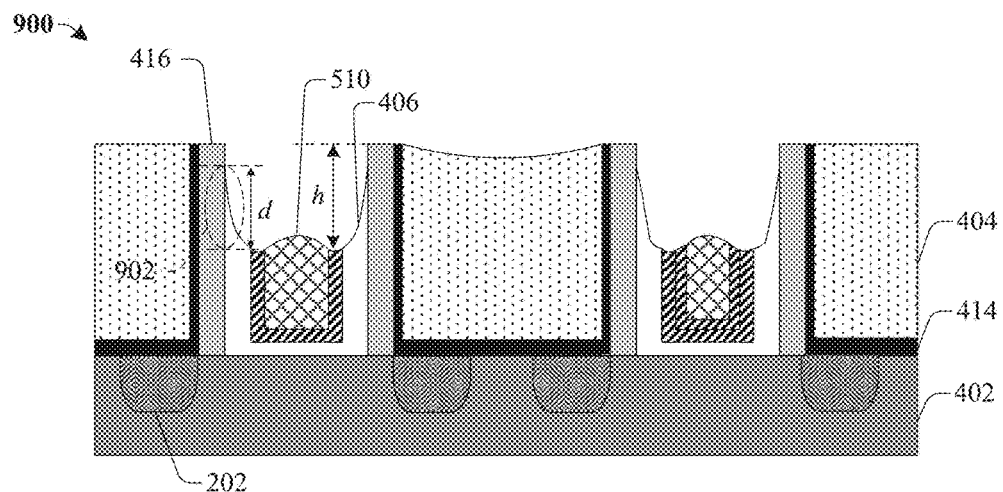

FIGS. 7-9 illustrate some embodiments of cross-sectional views 700, 800 and 900 corresponding to act 308, in which a first etch or first series of etches are performed to reduce the heights of high-κ dielectric layer 406 and the metal gates 532a, 532b.

As shown in FIG. 7's cross-sectional view 700, a metal break-through etch is performed to remove the residue film 602 and expose upper surfaces of the metal gates 532a, 532b.

As shown in FIG. 8's cross-sectional view 800, a work function metal etch, which can have a different etch chemistry or different etch conditions from the metal break through etch, is performed to etch back an upper portion of the high-κ dielectric layer 406 and upper portions of the barrier layer 408, the work function metal layer 409, and the metal layer 510.

As shown in FIG. 9's cross-sectional view 900, a high-κ etch is the performed to selectively remove high-κ dielectric layer 406. In some embodiments, the high-κ etch may be a dry etch with the same or different etch chemistry and/or the same or different etch conditions from the break-through etch 700 and/or work function metal etch 800. The high-κ etch is followed by a cleaning process containing chlorine gas. A number of high-κ etching and cleaning process cycles, for example, five or more, can be applied to produce the structure illustrated in FIG. 9. As an example, the break-through etch 700, work function metal etch 800, and high-κ etch 900 can lower the high-κ dielectric layer 406 and the metal gates 532 by a height h of about 50 nm. The high-κ dielectric layer 406 and the metal gates 532 may be etched to form angled upper surfaces, but a residue 902 (which may be referred to as antenna-shaped residue in some regards) is left along the sidewall spacer 416. The residue may have a height d about 11 nm.

Figure 10:
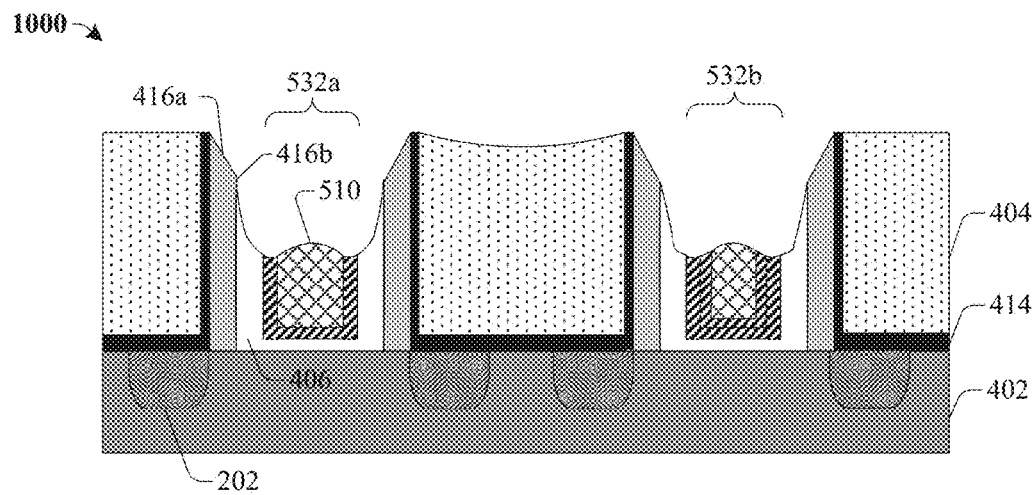

FIG. 10 illustrates some embodiments of a cross-sectional view 1000 corresponding to act 310. As shown in cross-sectional view 1000, a second etch, which may be referred to as a funnel etch in some regards, is performed to form a tapered upper surface for the sidewall spacer 416. A height of the sidewall spacer 416 monotonically decreases as approaching the metal gates 532. In some embodiments, the second etch comprises a physical etching process, such as a sputtering process whereby a stream of atoms, molecules, or ions are directed towards the structure and the force of impact from the atoms, molecules, or ions ejects material from the structure. In this way, atoms with high atomic masses such as argon (Ar) can be used as energy particles to remove a top inner edge portion of the sidewall spacer 416. As an example, a sputtering etch can be applied with a chamber pressure of about 6 millitorr (mT) and a flow rate of about 200 standard cubic centimeters per minute (sccm) with a bias of about 200 volt (V). In some embodiments, the stream of ions are directed towards the structure at an angle of incidence of other than ninety degrees (e.g., a non-normal angle of incidence). The angle of incidence for the stream of atoms, molecules, or ions can correspond to an angle at which the top edge portion of the sidewall spacer (416a) meets substantially vertical sidewall of sidewall spacer (416b). Thus an upper region of the recesses are wider than a lower region of the recesses.

Figure 11:
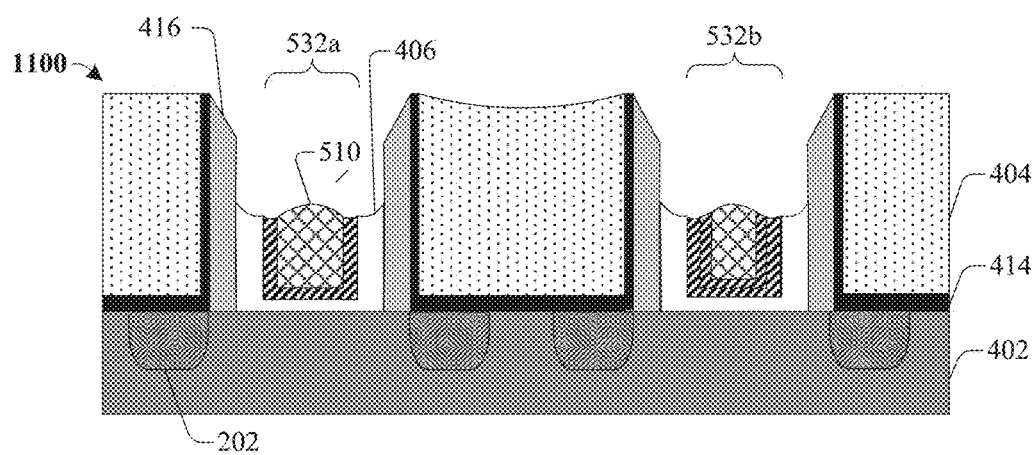
Figure 12:
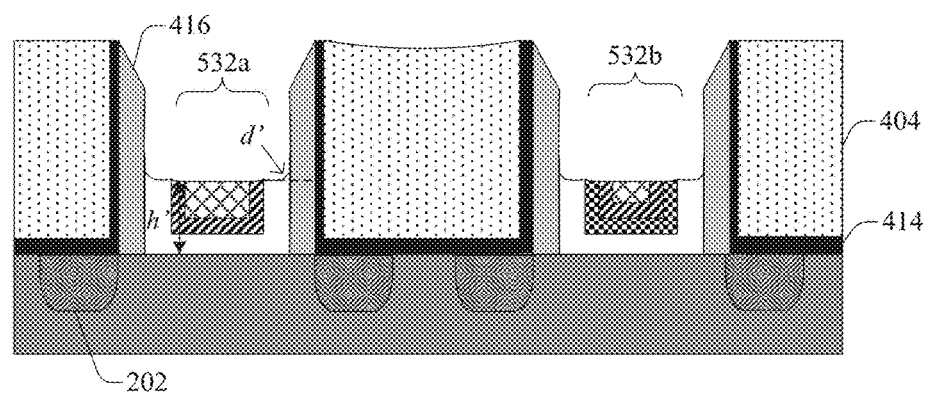

FIGS. 11-12 illustrate some embodiments of cross-sectional views 1100, 1200 corresponding to act 312 to perform a third series of etch is performed to remove the residue of the high-κ dielectric layer 406 and planarize the metal gates 532.

As shown in FIG. 11's cross-sectional view 1100, a high-κ etch process is then performed to selectively remove portions of the high-κ dielectric layer 406. Thus, the antenna-shaped high-κ residue is removed and/or reduced. The tapered shape of the sidewall spacer 416 aids in this process, as it allows the high-κ etch to better remove the residue.

As shown in FIG. 12's cross-sectional view 1200, the metal gates 532 are then selectively etched, resulting in a metal gate structure having an upper surface that is substantially planar with upper surfaces of the high-κ dielectric, barrier layer, and work function metal. The high-κ dielectric layer 406 and the metal gates 532 can have a height h' about 47 nm. The remaining metal residue, if any, can be removed with the tapered sidewall spacer 416 in place. In some embodiments, the high-κ dielectric layer 406 and the metal gates 532 have top surfaces that are co-planar. In other embodiments, a much smaller tip residue, having a height d' less than about 6 nm, is left along the sidewall spacer 416, comparing to the height d of the residue before the third series of etches.

Figure 13:
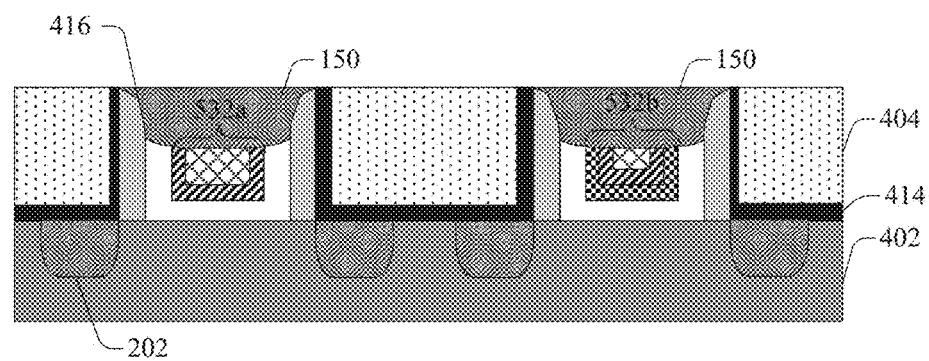

FIG. 13 illustrates some embodiments of a cross-sectional view 1300 corresponding to act 314. As shown in cross-sectional view 1300, a hard mask layer 150 is formed on planarized metal gate 532 and the high-κ dielectric layer 406. The hard mask layer 150 extends upwardly over the sidewall spacer 416 and the ILD layer 404 and is planarized such that top surfaces of the ILD layer 404, the sidewall spacer 416 and the hard mask layer 150 are laterally aligned.

Figure 14:
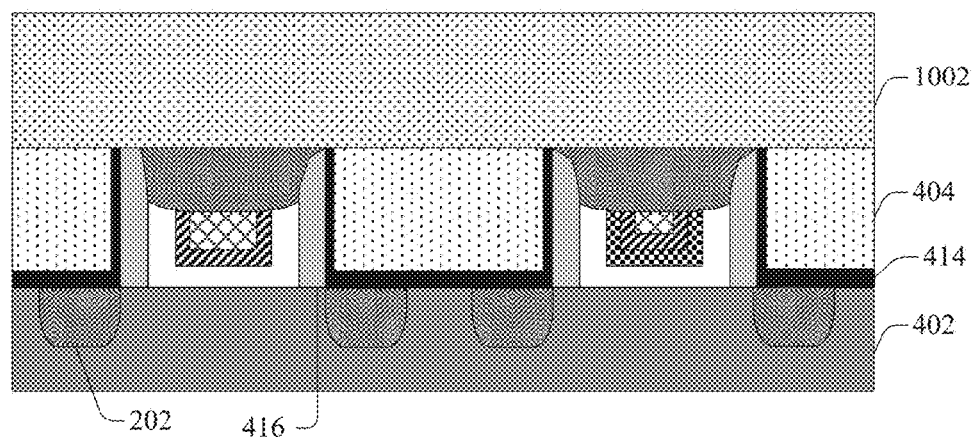
Figure 15:
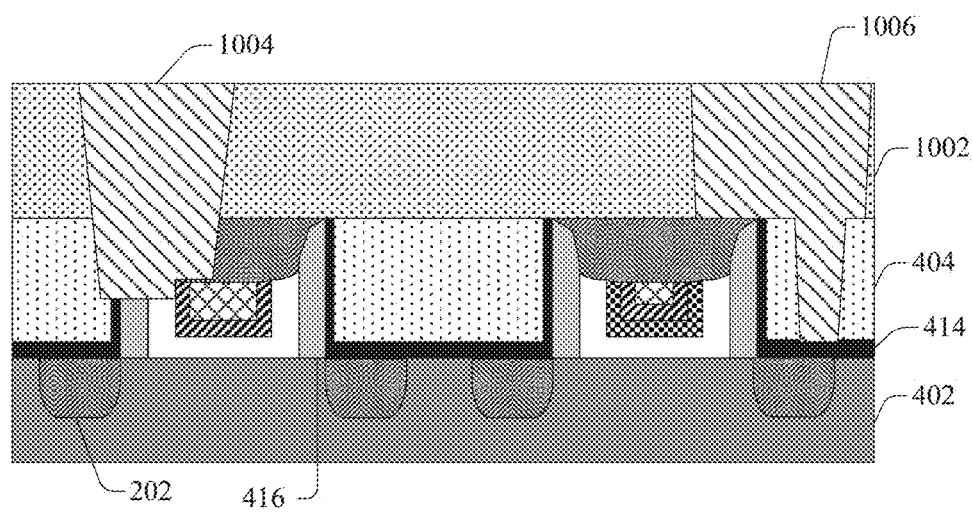

FIGS. 14-15 illustrate some embodiments of cross-sectional views 1400, 1500 corresponding to act 316. As shown in cross-sectional view 1400, a second ILD layer 1002 is formed over the ILD layer 404, the sidewall spacer 416, and the hard mask layer 150. As shown in cross-sectional view 1500, contacts 1004 are formed for metal gates 532 and contacts 1006 are formed for source/drain regions 202. The contacts 1004, 1006 are formed through a second ILD layer 1002 formed over the ILD layer 404, the sidewall spacer 416 and the hard mask layer 150.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

Accordingly, the present disclosure relates to a structure and method for forming an integrated circuit having a field effect device. After an initial etch back of the metal gates and the surrounding high-κ dielectric layer, the sidewall spacer, which is disposed along the high-κ dielectric layer, is etched to form a tapered upper surface. Thus aspect ratio is decreased and a residue of the metal gates and the high-κ dielectric layer can be removed more thoroughly by a following etching process. A better profile of the metal gate and high-κ layer, which could mean more flat, is achieved to prevent missing gate and improve yields and performance of the field effect device.

In some embodiments, the present disclosure relates to a method of forming a field effect transistor (FET) over a substrate. The method comprises forming a recess through an inter-layer dielectric (ILD) layer along a sidewall spacer and forming a high-κ dielectric layer to cover bottom and sidewall surfaces of the recess. The method further comprises forming a metal gate within a reminder of the recess not occupied by the high-κ dielectric layer. The method further comprises performing a first series of etch to lower the high-κ dielectric layer and the metal gate, a residue of the high-κ dielectric layer being left along the sidewall spacer. The method further comprises performing a second etch to form a tapered upper surface for the sidewall spacer, a height of the sidewall spacer monotonically decreasing as approaching the metal gate. The method further comprises performing a third series of etch to remove the residue of the high-κ dielectric layer and planarize the metal gate.

In another embodiment, the present disclosure relates to a method of forming an integrated circuit (IC). The method comprises forming a first recess corresponding to a first metal gate for a n-channel field effect transistor (n-FET) and a second recess corresponding to a second metal gate for a p-channel field effect transistor (p-FET) through an inter-layer dielectric (ILD) layer over a substrate, the first and second recesses formed along a sidewall spacer. The method further comprises forming a high-κ dielectric layer over bottom surfaces of the first and second recesses and along the sidewall spacer and forming a first metal gate and a second metal gate respectively within the first and second recesses. The method further comprises performing a planarization such that upper surfaces of the ILD layer, the sidewall spacer, the high-κ dielectric layer and the first and second metal gate are co-planed. The method further comprises performing a sputtering etch to form a tapered upper surface for the sidewall spacer. The method further comprises performing a series of etches to lower the high-κ dielectric layer and the metal gates.

In yet another embodiment, the present disclosure relates to a FinFET device. The FinFET device comprises a fin disposed over a planar substrate and an inter-layer dielectric (ILD) layer disposed over the substrate overlying the fin comprising a first recess and a second recess disposed within the ILD layer. The FinFET device further comprises a sidewall spacer disposed along sidewalls of the recesses. The FinFET device further comprises a first metal gate disposed within the first recess and a second metal gate disposed within the second recess surrounding top and sidewall surfaces of the fin. The FinFET device further comprises a high-κ dielectric layer disposed between the sidewall spacer and the metal gates and extended across bottom surfaces of the metal gates. The sidewall spacer has a tapered upper surface higher than the upper surface of the high-κ dielectric layer and a height of the sidewall spacer monotonically decreases as approaching the metal gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a field effect transistor (FET) over a substrate, comprising:
    forming a recess through an inter-layer dielectric (ILD) layer along a sidewall spacer;
    forming a high-κ dielectric layer to cover bottom and sidewall surfaces of the recess;
    forming a metal gate within a remainder of the recess not occupied by the high-κ dielectric layer;
    performing a first series of one or more etches to lower the high-κ dielectric layer and the metal gate, a residue of the high-κ dielectric layer being left along the sidewall spacer;
    performing a second etch to form a tapered upper surface for the sidewall spacer, a height of the sidewall spacer monotonically decreasing as approaching the metal gate; and
    performing a third series of one or more etches to remove the residue of the high-κ dielectric layer and planarize the metal gate.

2. The method of claim 1, wherein the second etch comprises a physical etching process.

3. The method of claim 1, wherein the second etch is a sputtering process using argon (Ar) atoms.

4. The method of claim 1, wherein the metal gate is formed by a tungsten (W) material.

5. The method of claim 1, wherein upper surfaces of the ILD layer, the sidewall spacer, the high-κ dielectric layer and the metal gate are laterally aligned before performing the first series of one or more etches.

6. The method of claim 1, after the third series of one or more etches, further comprising:
    forming a hard mask layer on the metal gate and the high-κ dielectric layer, extending upwardly over the sidewall spacer and the ILD layer; and
    performing a planarization such that top surfaces of the ILD layer, the sidewall spacer and the hard mask layer are laterally aligned.

7. The method of claim 1,
    wherein the substrate is a planar substrate with at least one fin disposed over the planar substrate.

8. A method of forming an integrated circuit (IC), comprising:
    forming a first recess corresponding to a first metal gate for an n-channel field effect transistor (n-FET) and a second recess corresponding to a second metal gate for a p-channel field effect transistor (p-FET) through an inter-layer dielectric (ILD) layer over a substrate, the first and second recesses formed between respective neighboring pairs of sidewall spacers;
    forming a high-κ dielectric layer over bottom surfaces of the first and second recesses and along inner sidewalls of the sidewall spacers;
    forming the first metal gate and the second metal gate respectively within the first and second recesses;
    performing a planarization such that upper surfaces of the ILD layer, sidewall spacers, the high-κ dielectric layer, and the first and second metal gate are co-planar;
    performing a sputtering etch to form a tapered upper surface for the sidewall spacer; and
    performing a series of etches to reduce heights of the high-κ dielectric layer and the metal gates.

9. The method of claim 8, further comprising:
    forming a barrier layer within the first and second recesses respectively between the high-κ dielectric layer and the first and second metal gates; and
    forming a work function metal layer within the second recess but not the first recess between the barrier layer and the high-κ dielectric layer.

10. The method of claim 8, further comprising:
    forming a hard mask layer on the metal gate and the high-κ dielectric layer, wherein an upper surface of the hard mask layer is co-planar with that of the ILD layer.

11. The method of claim 8, wherein the high-κ dielectric layer is formed having a bottom surface aligned with that of the sidewall spacer.

12. The method of claim 8, wherein the metal gates comprise tungsten (W).

13. The method of claim 8, wherein the substrate includes at least one semiconductor fin and the first and second metal gates are formed surrounding top and sidewall surfaces of the fin.

14. A method of forming a field effect transistor (FET) over a substrate, comprising:
    forming a recess through an inter-layer dielectric (ILD) layer along a sidewall spacer;
    forming a high-κ dielectric layer and a metal gate in the recess;

performing a first etch process to lower the metal gate and the high-κ dielectric layer;

performing a second etch process to taper an upper portion of the sidewall spacer not covered by the high-κ dielectric layer and the metal gate; and performing a third etch process to remove a residue of the high-κ dielectric layer and the metal gate.

15. The method of claim 14, wherein the second etch process comprises a sputtering process.

16. The method of claim 14, wherein the substrate comprises at least one fin disposed on a planar substrate.

17. The method of claim 14, further comprising:

forming a dummy gate stack comprising a dummy gate and a dummy gate dielectric having aligned sidewalls and the sidewall spacer arranged along the sidewalls of the dummy gate and the dummy gate dielectric; and removing the dummy gate and the dummy gate dielectric to form the recess.

18. The method of claim 14, wherein the high-κ dielectric layer is formed to cover bottom and sidewall surfaces of the recess.

19. The method of claim 14, wherein a planarization process is performed prior to the first etch process such that upper surfaces of the ILD layer, the sidewall spacer, the high-κ dielectric layer and the metal gate are laterally aligned.

20. The method of claim 14, after the third etch process, further comprising:

forming a hard mask layer on the metal gate and the high-κ dielectric layer, extending upwardly over the sidewall spacer and the ILD layer; and performing a planarization such that top surfaces of the ILD layer, the sidewall spacer and the hard mask layer are laterally aligned.

* * * * *